United States Patent
Ichijo et al.

(10) Patent No.: US 11,183,949 B2
(45) Date of Patent: Nov. 23, 2021

(54) POWER CONVERSION DEVICE WITH A COOLANT PASSAGE

(71) Applicant: DENSO CORPORATION, Kariya (JP)

(72) Inventors: Hiromi Ichijo, Kariya (JP); Kazuya Takeuchi, Kariya (JP); Kenichi Hasegawa, Kariya (JP)

(73) Assignee: DENSO CORPORATION, Kariya (JP)

(*) Notice: Subject to any disclaimer, the term of this patent is extended or adjusted under 35 U.S.C. 154(b) by 64 days.

(21) Appl. No.: 16/806,309

(22) Filed: Mar. 2, 2020

(65) Prior Publication Data
US 2020/0204085 A1 Jun. 25, 2020

Related U.S. Application Data

(63) Continuation of application No. PCT/JP2018/032058, filed on Aug. 30, 2018.

(30) Foreign Application Priority Data

Aug. 31, 2017 (JP) .............................. JP2017-167636

(51) Int. Cl.
*H02M 7/537* (2006.01)
*B60L 15/00* (2006.01)
(Continued)

(52) U.S. Cl.
CPC .......... *H02M 7/537* (2013.01); *B60L 15/007* (2013.01); *H01L 23/3675* (2013.01);
(Continued)

(58) Field of Classification Search
CPC .... H02M 7/537; H02M 7/5387; H02M 7/003; H02M 1/007; H02M 1/008; H02M 3/158;
(Continued)

(56) References Cited

U.S. PATENT DOCUMENTS

2010/0097765 A1* 4/2010 Suzuki .................. B60K 6/405
361/699
2010/0321889 A1* 12/2010 Yoshino ............. H05K 7/20927
361/702
(Continued)

FOREIGN PATENT DOCUMENTS

JP 2015-42131 A 3/2015
JP 2015-053776 A 3/2015

OTHER PUBLICATIONS

Oct. 16, 2018 International Search Report issued in International Patent Application No. PCT/JP2018/032058.

*Primary Examiner* — Emily P Pham
(74) *Attorney, Agent, or Firm* — Oliff PLC (57) ABSTRACT

A power conversion device includes a semiconductor stack, a reactor, and a capacitor. The semiconductor stack includes a plurality of semiconductor modules stacked on one another in a stacking direction. Each semiconductor module includes a semiconductor element. The reactor constitutes a boost circuit that boosts a direct-current voltage. The capacitor is electrically connected to the plurality of semiconductor modules. The semiconductor stack, the reactor, and the capacitor each include a coolant flow passage, and the reactor and the capacitor are located adjacent to each other.

3 Claims, 11 Drawing Sheets

(51) Int. Cl.
*H01L 23/367* (2006.01)
*H01L 23/473* (2006.01)
*H05K 7/20* (2006.01)

(52) U.S. Cl.
CPC ....... *H01L 23/473* (2013.01); *H05K 7/20927* (2013.01); *B60L 2210/40* (2013.01)

(58) Field of Classification Search
CPC .... B60L 15/007; B60L 2210/40; Y02T 10/72; Y02T 10/64; H01L 23/3675; H01L 23/473; H05K 7/20927
See application file for complete search history.

(56) References Cited

U.S. PATENT DOCUMENTS

2012/0250252 A1   10/2012   Iguchi
2016/0073556 A1   3/2016    Nakasaka

\* cited by examiner

POWER CONVERSION DEVICE WITH A COOLANT PASSAGE

CROSS-REFERENCE TO RELATED APPLICATION

The present application is a continuation application of International Application No. PCT/JP2018/032058, filed on Aug. 30, 2018, which claims priority to Japanese Patent Application No. 2017-167636 filed on Aug. 31, 2017. The contents of these applications are incorporated herein by reference in their entirety.

BACKGROUND

Technical Field

The present disclosure relates to a power conversion device that converts power between direct-current power and alternating-current power.

Background Art

In the prior art, a power conversion device converts power between direct-current power and alternating-current power, and includes a semiconductor stack, a smoothing capacitor, and a reactor for boosting voltage. The semiconductor stack is constituted by multiple semiconductor modules stacked on one another. Each semiconductor module includes semiconductor elements.

SUMMARY

In the present disclosure, provided is a power conversion device as the following. A semiconductor stack, a reactor, and a capacitor each include a coolant flow passage, and the reactor and the capacitor are located adjacent to each other. The coolant flow passage of the capacitor is located below a capacitor element of the capacitor in a vertical direction orthogonal to the stacking direction, and is configured to extend in the stacking direction. The coolant flow passage of the reactor includes a facing flow passage, which is located to face the capacitor element, and the facing flow passage is configured to extend in the stacking direction along the coolant flow passage of the capacitor.

BRIEF DESCRIPTION OF THE DRAWINGS

The object of the present disclosure, other objects, features, and advantages will become more apparent by the following detailed description with reference to the accompanying drawings in which.

DETAILED DESCRIPTION OF THE PREFERRED EMBODIMENTS

Conventionally, the following PTL 1 discloses a power conversion device mounted on a vehicle such as an electric vehicle and a hybrid vehicle. The power conversion device converts power between direct-current power and alternating-current power, and includes a semiconductor stack, a smoothing capacitor, and a reactor for boosting voltage. The semiconductor stack is constituted by multiple semiconductor modules stacked on one another. Each semiconductor module includes semiconductor elements.

In the power conversion device, the semiconductor stack, which is a heat-producing component, is provided with a first coolant flow passage through which a coolant flows. The first coolant flow passage is located between two adjacent semiconductor modules. The capacitor, which is another heat-producing component, is provided with a second coolant flow passage, which communicates with the first coolant flow passage. The second coolant flow passage is located between the capacitor and the semiconductor stack. Thus, the coolant that flows through the first coolant flow passage cools each semiconductor module of the semiconductor stack, and the coolant that further flows from the first coolant flow passage to the second coolant flow passage cools the capacitor.

[PTL 1] Japanese Laid-Open Patent Publication No. 2015-53776

In designing this type of power conversion device, besides cooling the semiconductor stack and the capacitor as in the above-described power conversion device, there is a request that the cooling performance be improved by efficiently cooling the heat-producing components including the reactors.

The present disclosure is intended to provide a power conversion device that has improved cooling performance for cooling heat-producing components.

One aspect of the present disclosure provides a power conversion device, which includes a semiconductor stack, a reactor, and a capacitor. The semiconductor stack includes a plurality of semiconductor modules stacked on one another in a stacking direction. Each semiconductor module includes a semiconductor element. The reactor constitutes a boost circuit that boosts a direct-current voltage. The capacitor is electrically connected to the plurality of semiconductor modules. The semiconductor stack, the reactor, and the capacitor each include a coolant flow passage, and the reactor and the capacitor are located adjacent to each other. The coolant flow passage of the capacitor is located below a capacitor element of the capacitor in a vertical direction orthogonal to the stacking direction, and is configured to extend in the stacking direction. The coolant flow passage of the reactor includes a facing flow passage, which is located to face the capacitor element, and the facing flow passage is configured to extend in the stacking direction along the coolant flow passage of the capacitor.

In the power conversion device, the coolant that flows through the coolant flow passage of the reactor, which is one of the heat-producing components, functions to cool the capacitor located adjacent to the reactor besides functioning to cool the reactor. Similarly, the coolant that flows through the coolant flow passage of the capacitor, which is another heat-producing component, functions to cool the reactor which is located adjacent to the capacitor, besides functioning to cool the capacitor. That is, the coolant flowing through the coolant flow passage of one of the reactor and capacitor also cools the other one of the reactor and capacitor. Thus, compared with the case in which the reactor and the capacitor are cooled by the coolant that flows through a dedicated coolant flow passage, the reactor and the capacitor are efficiently cooled.

As described above, the above aspect provides the power conversion device that has improved cooling performance for cooling the heat-producing components.

Reference signs in parentheses in the scope of claims indicate the correspondence to specific means disclosed in the embodiments described below and do not limit the technical scope of the present disclosure.

Hereinafter, a power conversion device according to an embodiment will be described with reference to the drawings.

In the drawings of the present description, unless otherwise specified, a stacking direction of semiconductor modules constituting a semiconductor stack is indicated by arrow X, an orthogonal direction that is orthogonal to the stacking direction is indicated by arrow Y, and a vertical direction (also referred to as a height direction) that is orthogonal to both the stacking direction X and the orthogonal direction Y is indicated by arrow Z.

First Embodiment

Figure 1:
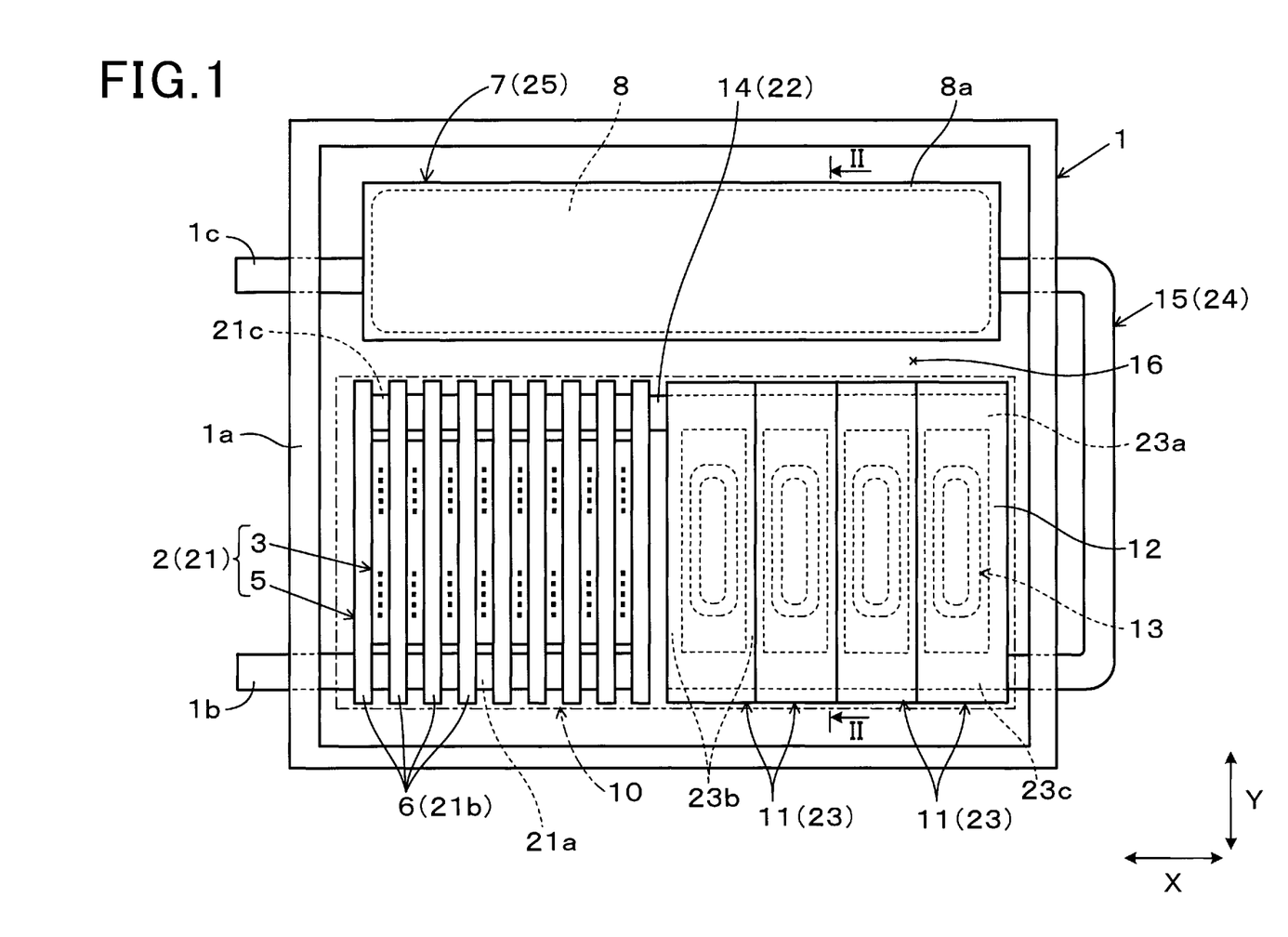
FIG. 1 is a plan view of a power conversion device according to a first embodiment illustrating the outline.

As shown in FIG. 1, a power conversion device 1 according to the first embodiment accommodates a semiconductor stack 2, reactors 11, a capacitor 7, a converter 9 (refer to FIG. 4), and a control circuit substrate 10 in a case 1a. The power conversion device 1 is mounted on, for example, an electric vehicle or a hybrid vehicle and is used as an inverter that converts direct-current supply power to alternating-current power necessary for driving a drive motor.

The semiconductor stack 2 is formed by stacking semiconductor modules 3 one on another in the stacking direction X. Each semiconductor module 3 includes semiconductor elements 4 (refer to FIG. 3). The semiconductor stack 2 includes a cooling device 5, which includes cooling pipes 6. In the semiconductor stack 2, the semiconductor modules 3 and the cooling pipes 6 of the cooling device 5 are alternately stacked in the stacking direction X. That is, each semiconductor module 3 is sandwiched between two of the cooling pipes 6 from both sides in the stacking direction X.

The number of the semiconductor modules 3 stacked one on another in the semiconductor stack 2 may be set as required.

The semiconductor stack 2 includes a coolant flow passage 21 through which a coolant flows. The coolant flow passage 21 is constituted by an inlet header 21a, cooling portions 21b, and an outlet header 21c.

The inlet header 21a is a flow passage extending in the stacking direction X. The upstream end of the inlet header 21a communicates with an inflow pipe 1b, and the inlet header 21a communicates with respective inlets of the cooling pipes 6 at the section downstream of the inlet header 21a. The cooling portions 21b are respectively formed as flow passages that extend in the orthogonal direction Y between the inlet header 21a and the outlet header 21c. The outlet header 21c is a flow passage that extends in the stacking direction X and is parallel to the inlet header 21a. The outlet header 21c communicates with each outlet of the cooling pipes 6 and communicates with a connecting pipe 14.

As the coolant that flows in through the inflow pipe 1b, for example, a natural coolant such as water and ammonia, water mixed with ethylene glycol-based antifreeze, a fluorocarbon-based coolant such as Fluorinert (registered trademark), a chlorofluorocarbon-based coolant such as HCFC123 and HFC134a, an alcohol-based coolant such as methanol and alcohol, or a ketone-based coolant such as acetone is preferably used.

The reactors 11 are stacked on one another in the stacking direction X. That is, the reactors 11 are stacked in a direction that is the same as the stacking direction X of the semiconductor modules 3. Each reactor 11 is an electronic component that functions to convert electrical energy to magnetic energy using an inductor. Each reactor 11 accommodates a coil 13, which generates magnetic flux upon energization, in the case 12. The reactors 11 constitute an inverter circuit (an inverter circuit 30, which will be described below) of the power conversion device 1 together with the semiconductor modules 3 and, more specifically, constitute boost circuits (boost sections 31, which will be described below) for boosting the direct-current voltage, which is an input voltage to the semiconductor modules 3.

The number of the reactors 11 are set as required.

The reactors 11 include a coolant flow passage 23 through which the coolant flows. The coolant flow passage 23 includes an inlet header 23a, cooling portions 23b, and an outlet header 23c.

The inlet header 23a is a flow passage that extends in the stacking direction X and communicates with the outlet header 21c of the coolant flow passage 21 through a coolant flow passage 22 of the connecting pipe 14. The cooling portions 23b are formed as flow passages that extend in the orthogonal direction Y between the inlet header 23a and the outlet header 23c. The outlet header 23c is a flow passage that extends in the stacking direction X parallel to the inlet header 23a with the coils 13 located in between and communicates with the inlet of a connecting pipe 15.

The capacitor 7 is electrically connected to the semiconductor modules 3. The capacitor 7 includes, a capacitor 7a for removing a noise current contained in the current supplied from a direct-current power supply in the boost sections 31 which will be described below, and a capacitor 7b which smoothes the direct-current voltage boosted by the boost sections 31 (refer to FIG. 4). The capacitor 7a is also referred to as a filter capacitor, and the capacitor 7b is also referred to as a smoothing capacitor. A capacitor element 8 of these capacitors 7a and 7b is accommodated in a case 8a. The capacitor 7 may be referred to as a capacitor module including the capacitor 7a and the capacitor 7b.

The capacitor 7 includes a coolant flow passage 25 through which the coolant flows. The coolant flow passage 25 is located below the capacitor element 8 in the vertical direction Z (refer to FIG. 2). Thus, the structure for cooling the capacitor 7 is simplified.

The coolant flow passage 25 of the capacitor 7 is configured such that the upstream end of the coolant flow passage 25 communicates with the outlet of the connecting pipe 15, and the downstream end of the coolant flow passage 25 communicates with an outflow pipe 1c. With this structure, the coolant that has flowed into the coolant flow passage 25 through a coolant flow passage 24 of the connecting pipe 15 flows toward the outflow pipe 1c through the coolant flow passage 25 and then flows out of the outflow pipe 1c. At this time, the heat generated in the capacitor 7 is transferred to the coolant flowing through the coolant flow passage 25, so that the capacitor 7 is cooled.

In the power conversion device 1, the reactors 11 are located adjacent to the semiconductor stack 2 in the stacking direction X. The capacitor 7 extends along the stacking direction X and faces both the reactors 11 and the semiconductor stack 2 in the orthogonal direction Y, which is orthogonal to the stacking direction X, with a space 16 formed in between. Thus, the reactors 11 and the capacitor 7 are adjacent to each other in the orthogonal direction Y.

Figure 2:
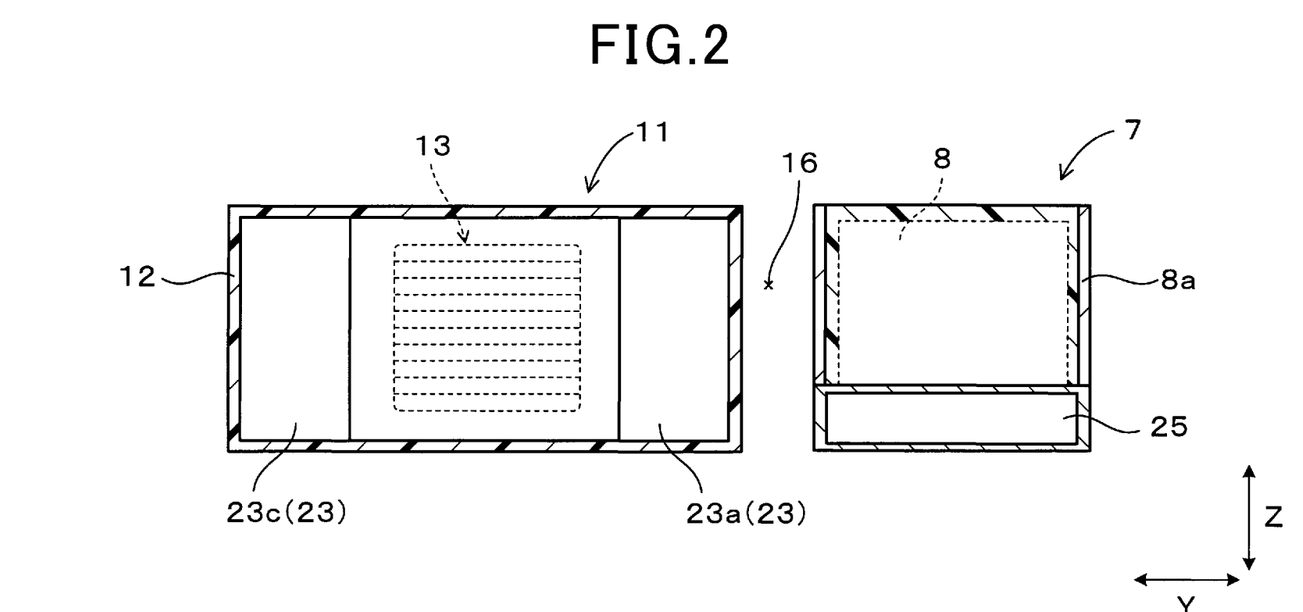
FIG. 2 is a cross-sectional view taken along line II-II of FIG. 1 as viewed from the direction of arrows.

As shown in FIG. 2, the inlet header 23a, which constitutes the coolant flow passage 23 for the reactors 11, forms a facing flow passage that is located to face the side of the capacitor element 8 of the capacitor 7 in the orthogonal direction Y with the space 16 formed in between. With this arrangement, the capacitor element 8 is cooled by the heat exchange with the coolant that flows through the inlet header 23a in the reactors 11. That is, the coolant in the inlet header 23a used for cooling the coils 13 of the reactors 11 is also used for cooling the capacitor element 8 of the capacitor 7.

The coolant flow passage 25 of the capacitor 7 is located to face the reactors 11 in the orthogonal direction Y with the space 16 formed in between. With this arrangement, the reactors 11 are cooled by the heat exchange with the coolant that flows through the coolant flow passage 25 of the capacitor 7. That is, the coolant in the coolant flow passage 25 used for cooling the capacitor element 8 of the capacitor 7 is also used for cooling the coils 13 of the reactors 11.

Figure 3:
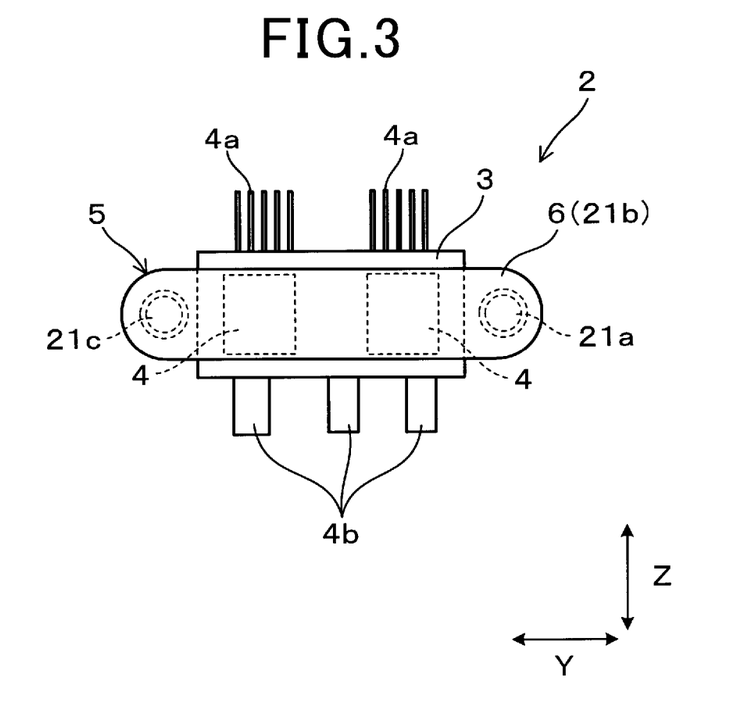
FIG. 3 is a diagram of a semiconductor stack in FIG. 1 viewed from a stacking direction of semiconductor modules.

As shown in FIG. 3, each semiconductor module 3 includes the semiconductor elements 4 such as insulated-gate bipolar transistors (IGBTs), which convert direct-current power to alternating-current power. The semiconductor module 3 includes control terminals 4a, which are electrically connected to the control circuit substrate 10, and power terminals 4b for supplying power. The control circuit substrate 10 controls the switching operation of the semiconductor elements 4 to convert direct-current power that is supplied to the semiconductor module 3 through the power terminal 4b to alternating-current power.

Figure 4:
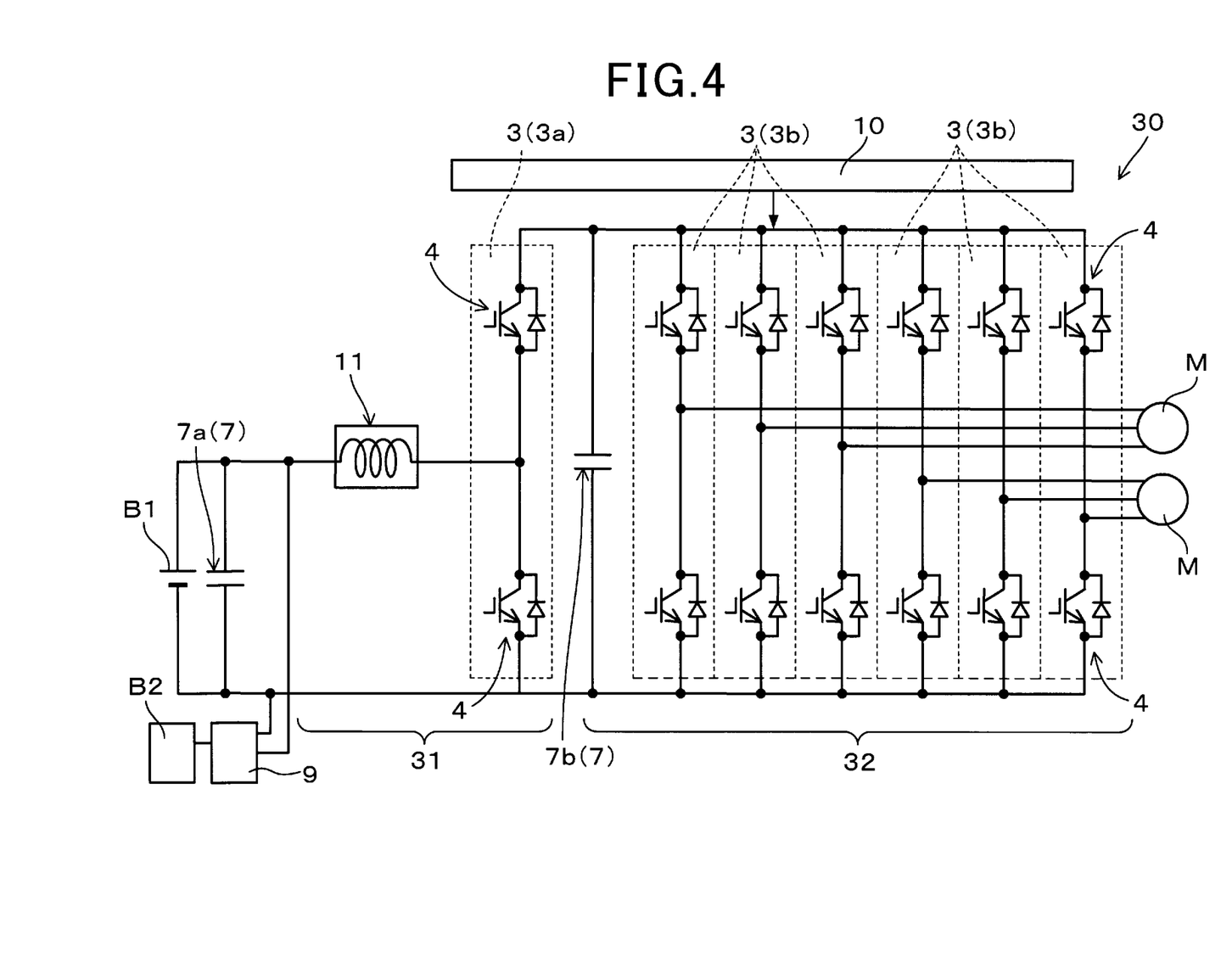
FIG. 4 is a circuit diagram of an inverter of the power conversion device according to the first embodiment.

As shown in FIG. 4, in the inverter circuit 30 of the power conversion device 1, the switching operation (ON/OFF operation) of the semiconductor elements 4 in each of the semiconductor modules 3 is controlled by the control circuit substrate 10, so that the direct-current power of a power supply B1, which is the direct-current power supply, is converted to alternating-current power. The semiconductor modules 3 are classified into a semiconductor module 3a and semiconductor modules 3b.

In the present embodiment, the capacitor 7a, the reactors 11, and the semiconductor module 3a constitute the boost sections 31, which are the boost circuits of the inverter circuit 30. The boost sections 31 function to boost the voltage of the power supply B1.

The capacitor 7b and the semiconductor modules 3b constitute converting sections 32 of the inverter circuit 30. The converting sections 32 function to convert the direct-current power boosted by the boost sections 31 to alternating-current power. The alternating-current power obtained by the converting sections 32 drives three-phase alternating motors M for running a vehicle.

In FIG. 4, for convenience of illustration, only one boost section 31 is shown. However, multiple boost sections 31 are actually parallel-connected in accordance with the number of the reactors 11 in FIG. 1. FIG. 4 shows the case in which the inverter circuit 30 includes two converting sections 32 so as to drive two three-phase alternating motors M. Instead, the structure in which one converting section 32 is provided to drive one three-phase alternating motor M may be employed.

The converter 9 is connected to the power supply B1 and is used to step down the voltage of the power supply B1 to charge an auxiliary battery B2, which has a lower voltage than that of the power supply B1. The auxiliary battery B2 is used as a power supply of various devices mounted on the vehicle.

The number and the arrangement of the elements constituting the above-described inverter circuit 30 are not limited to those illustrated in FIG. 4, but may be changed as required.

The flow of the coolant in the power conversion device 1 will be described with reference to FIG. 5. In the description, one direction in the stacking direction X will be referred to as a first direction D1 and the other direction is referred to as a second direction D2. One direction in the orthogonal direction Y will be referred to as a third direction D3 and the other direction will be referred to as a fourth direction D4.

Figure 5:
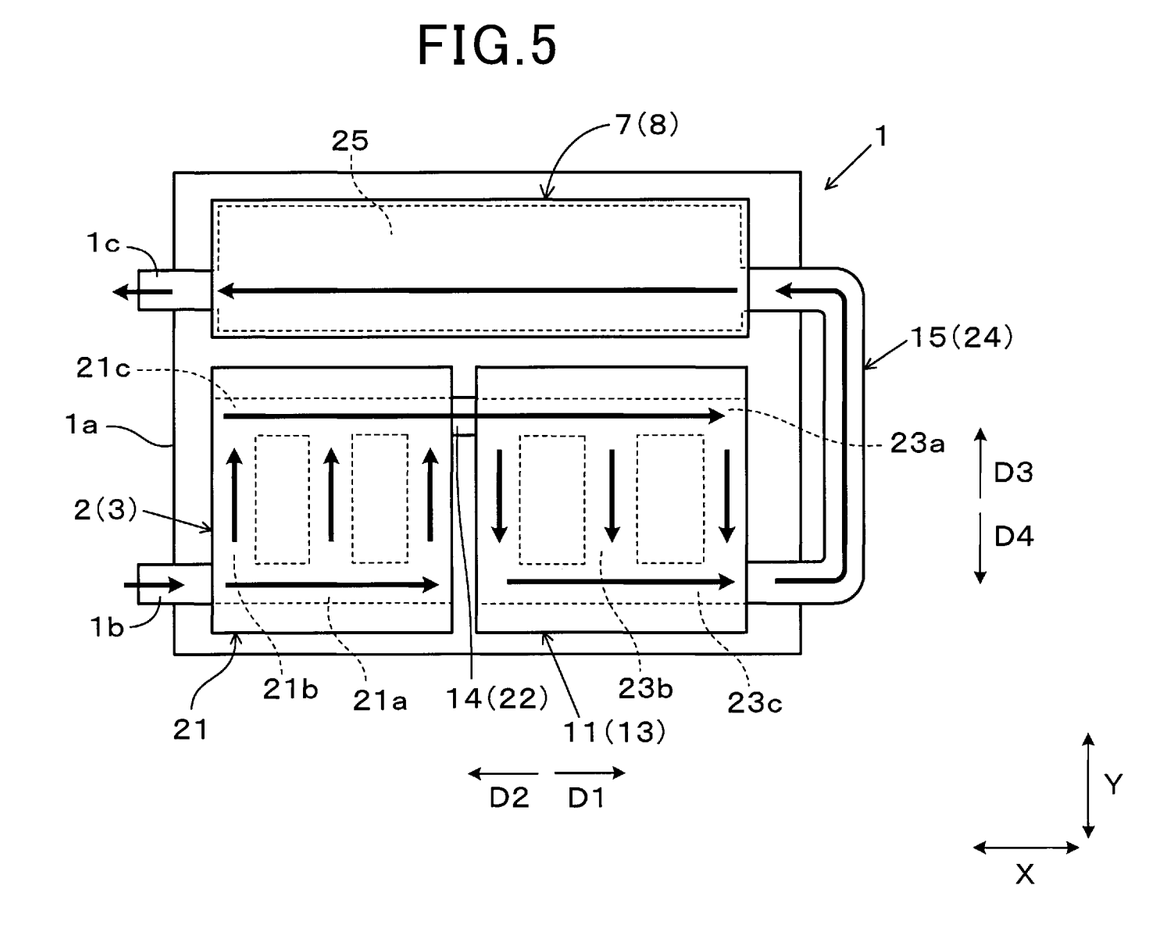
FIG. 5 is a schematic diagram illustrating a cooling structure of the power conversion device according to the first embodiment.

In FIG. 5, for convenience of illustration, the semiconductor stack 2 is simplified, and the multiple reactors 11 are shown as one reactor 11 for simplification. Thus, the structures of the coolant flow passage of the semiconductor stack 2 and the coolant flow passage of the reactors 11 differ from the structures of the coolant flow passages in FIG. 1.

As shown in FIG. 5, the coolant continuously flows through a coolant route from the inflow pipe 1b to the outflow pipe 1c. In the coolant route, the coolant flow passage 21 of the semiconductor stack 2, the coolant flow passage 23 of the reactors 11, and the coolant flow passage 25 of the capacitor 7 communicate with each other. With this structure, the coolant for cooling the three heat-producing components is shared, so that the structure of the coolant flow passage for cooling the three heat-producing components is simplified.

The coolant that flows in through the inflow pipe 1b first flows through the coolant flow passage 21 of the semiconductor stack 2.

In the coolant flow passage 21, the coolant that has flowed in through the inflow pipe 1b flows through the inlet header 21a in the first direction D1 while branching into the cooling portions 21b. The coolant in the cooling portions 21b then flows in the third direction D3 toward the outlet header 21c. At this time, the heat generated in the semiconductor modules 3 is transferred to the coolant that flows through the cooling portions 21b, so that the semiconductor modules 3 are cooled. The coolant that have flowed through the cooling portions 21b merge to flow through the outlet header 21c in the first direction D1 toward the connecting pipe 14.

The coolant that has merged in the outlet header 21c of the coolant flow passage 21 flows through the coolant flow passage 22 of the connecting pipe 14 and then flows into the coolant flow passage 23 of the reactors 11.

In the coolant flow passage 23, the coolant that has flowed in from the coolant flow passage 22 of the connecting pipe 14 flows through the inlet header 23a in the first direction D1 while branching into the cooling portions 23b. This forms a straight coolant flow in the first direction D1 from the outlet header 21c of the coolant flow passage 21 through the connecting pipe 14 to the inlet header 23a of the coolant flow passage 23.

The coolant in the cooling portions 23b flows in the fourth direction D4 toward the outlet header 23c. At this time, the heat generated in the coils 13 of the reactors 11 is transferred to the coolant flowing through the cooling portions 23b, so that the reactors 11 are cooled. The coolant that have flowed through the cooling portions 23b merge to flow through the outlet header 23c in the first direction D1 toward the connecting pipe 15.

The coolant that has merged in the outlet header 23c of the coolant flow passage 23 flows through the coolant flow passage 24 of the connecting pipe 15, thus changing the direction from the first direction D1 to the second direction D2 and subsequently flowing into the coolant flow passage 25 of the capacitor 7.

In the coolant flow passage 25, the coolant that has flowed in from the coolant flow passage 24 of the connecting pipe 15 flows in the second direction D2 toward the outflow pipe 1c and then flows out from the outflow pipe 1c. At this time, the heat generated in the capacitor element 8 of the capacitor 7 is transferred to the coolant that flows through the coolant flow passage 25, so that the capacitor element 8 is cooled.

Subsequently, the operational advantages of the first embodiment will be described.

In the power conversion device 1, since the reactors 11 and the capacitor 7 are located adjacent to each other in the orthogonal direction Y, the coolant that flows through the coolant flow passage 23 of the reactors 11 functions to cool the capacitor 7 located adjacent to the reactors 11 in addition to functioning to cool the reactors 11. The coolant that flows through the coolant flow passage 25 of the capacitor 7 also functions to cool the reactors 11 located adjacent to the capacitor 7 in addition to functioning to cool the capacitor 7. That is, the coolant that flows through the coolant flow passage of one of the reactors 11 and the capacitor 7 also cools the other one of the reactors 11 and the capacitor 7.

Furthermore, since the reactors 11 are located adjacent to the semiconductor stack 2 in the stacking direction X, and the capacitor 7 is located to face the reactors 11 and the semiconductor stack 2 in the orthogonal direction Y, the semiconductor stack 2, the reactors 11, and the capacitor 7 are efficiency cooled compared with the case in which they are each cooled by the coolant that flows through the dedicated coolant flow passage.

Consequently, the power conversion device 1 that has improved cooling performance for cooling the heat-producing components is provided. To improve the cooling performance, the dimension of the space 16 in the orthogonal direction Y is preferably reduced.

In the power conversion device 1, the coolant flow passage 25 of the capacitor 7 is located below the capacitor element 8, and the inlet header 23a constituting the coolant flow passage 23 of the reactors 11 is located to face the side of the capacitor element 8. Thus, the capacitor element 8 is cooled from both below and the side. This improves the cooling performance for cooling the capacitor element 8.

Hereinafter, other embodiments associated with the first embodiment will be described with reference to the drawings. In other embodiments, components that are the same as those of the first embodiment are given the same reference signs, and the detailed description of the same components will be omitted.

Second Embodiment

Figure 6:
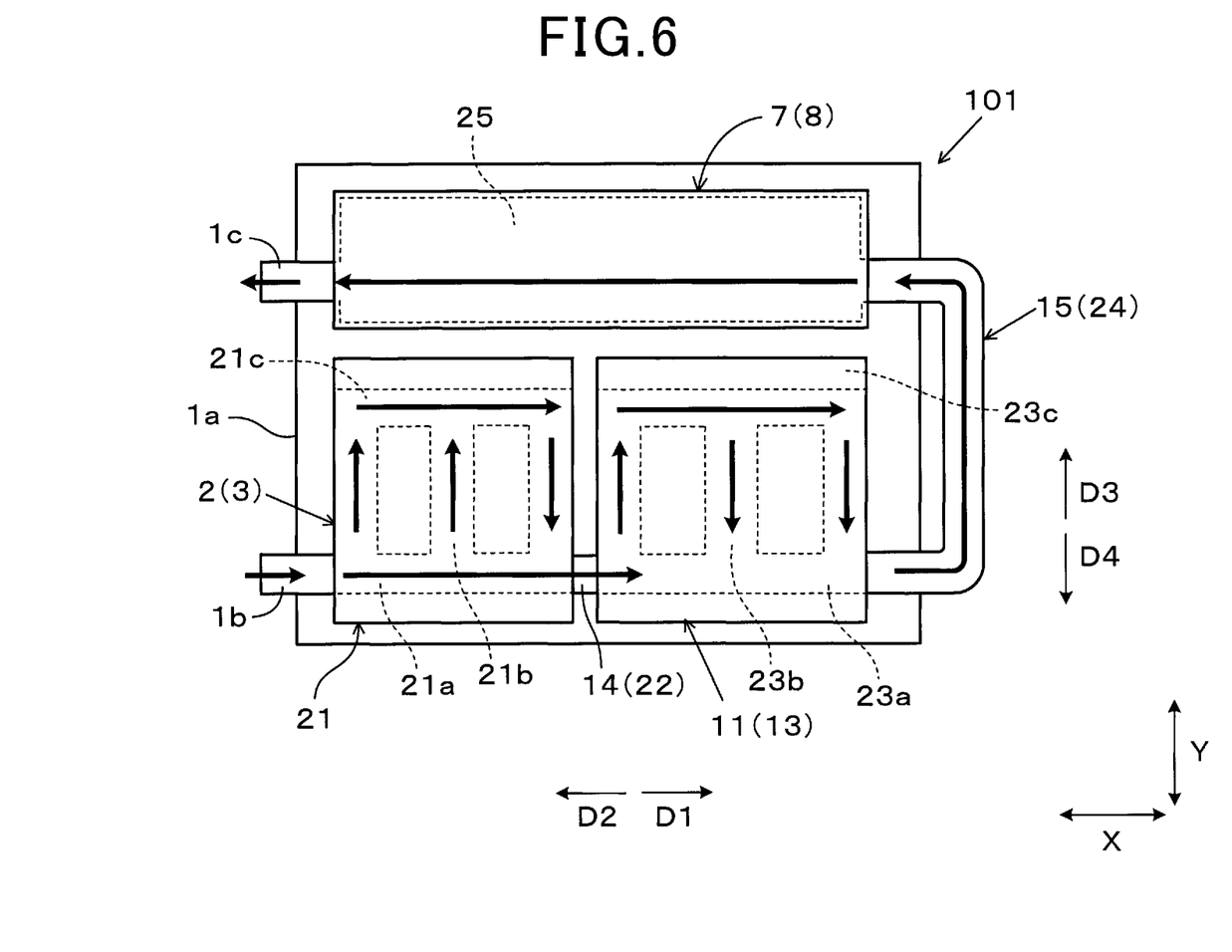
FIG. 6 is a schematic diagram illustrating a cooling structure of a power conversion device according to a second embodiment.

A power conversion device 101 of the second embodiment differs from the power conversion device 1 of the first embodiment in the structure of the coolant flow passage 23 of the reactors 11.

Other structures are the same as those of the first embodiment.

As shown in FIG. 6, in the second embodiment, the inlet header 23a and the outlet header 23c, which constitute the coolant flow passage 23, are in reverse position from the position in the first embodiment. That is, the inlet header 23a is located at a position further from the capacitor 7 with the outlet header 23c located in between.

This forms a straight coolant flow in the first direction D1 from the inlet header 21a of the coolant flow passage 21 through the connecting pipe 14 to the inlet header 23a of the coolant flow passage 23.

According to the power conversion device 101 of the second embodiment, the coolant route in the coolant flow passage 23 is changed to cool the reactors 11.

Additionally, operational advantages that are the same as those of the first embodiment are achieved.

Third Embodiment

Figure 7:
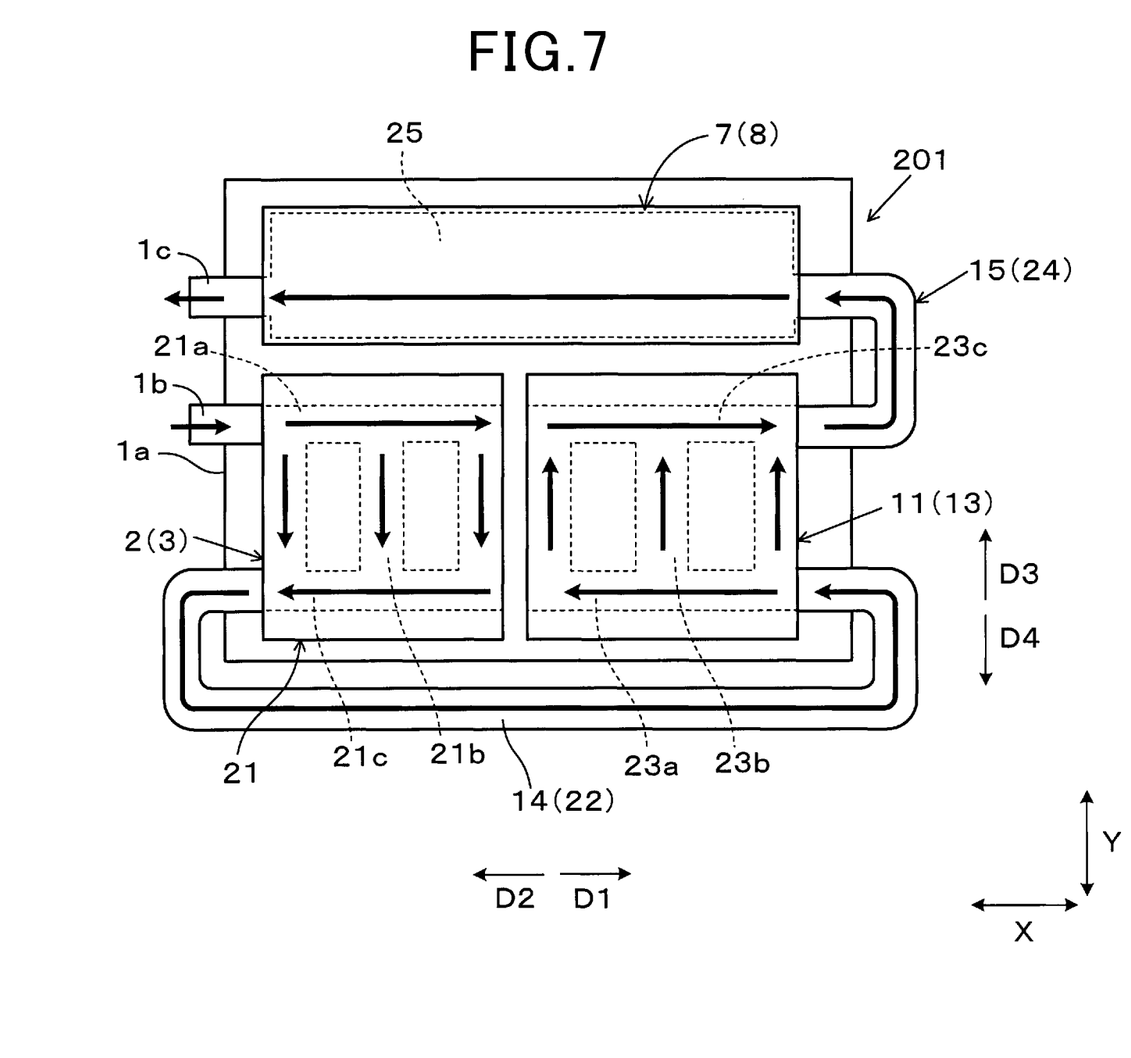
FIG. 7 is a schematic diagram illustrating a cooling structure of a power conversion device according to a third embodiment.

A power conversion device 201 of the third embodiment differs from the power conversion device 1 of the first embodiment in the structures of the coolant flow passage 21 of the semiconductor stack 2, the coolant flow passage 23 of the reactors 11, and the connecting pipe 14.

Other structures are the same as those of the first embodiment.

As shown in FIG. 7, in the third embodiment, the inlet header 21a and the outlet header 21c, which constitute the coolant flow passage 21, are in reverse position from the position in the first embodiment. That is, the outlet header 21c is located on the opposite side of the inlet header 21a from the capacitor 7.

Additionally, the inlet header 23a and the outlet header 23c, which constitute the coolant flow passage 23, are in reverse position from the position in the first embodiment. That is, the inlet header 23a is located at a position further from the capacitor 7 with the outlet header 23c located in between.

Furthermore, the inlet of the connecting pipe 14 is connected to the left one of the both ends of the outlet header 21c in the stacking direction X in FIG. 7, and the outlet of the connecting pipe 14 is connected to the right end of the inlet header 23a in FIG. 7.

Thus, in the coolant flow passage 21, the coolant in the cooling portions 21b flows in the fourth direction D4 toward the outlet header 21c, and the coolant in the outlet header 21c flows in the second direction D2 toward the inlet of the connecting pipe 14. In the coolant flow passage 23, the coolant in the inlet header 23a flows in the second direction D2 from the outlet of the connecting pipe 14, and the coolant in the cooling portions 23b flows in the third direction D3 toward the outlet header 23c.

According to the power conversion device 201 of the third embodiment, the semiconductor stack 2 is cooled by changing the coolant route in the coolant flow passage 21, and the reactors 11 are cooled by changing the coolant route in the coolant flow passage 23.

Additionally, the operational advantages that are the same as those of the first embodiment are achieved.

Fourth Embodiment

Figure 8:
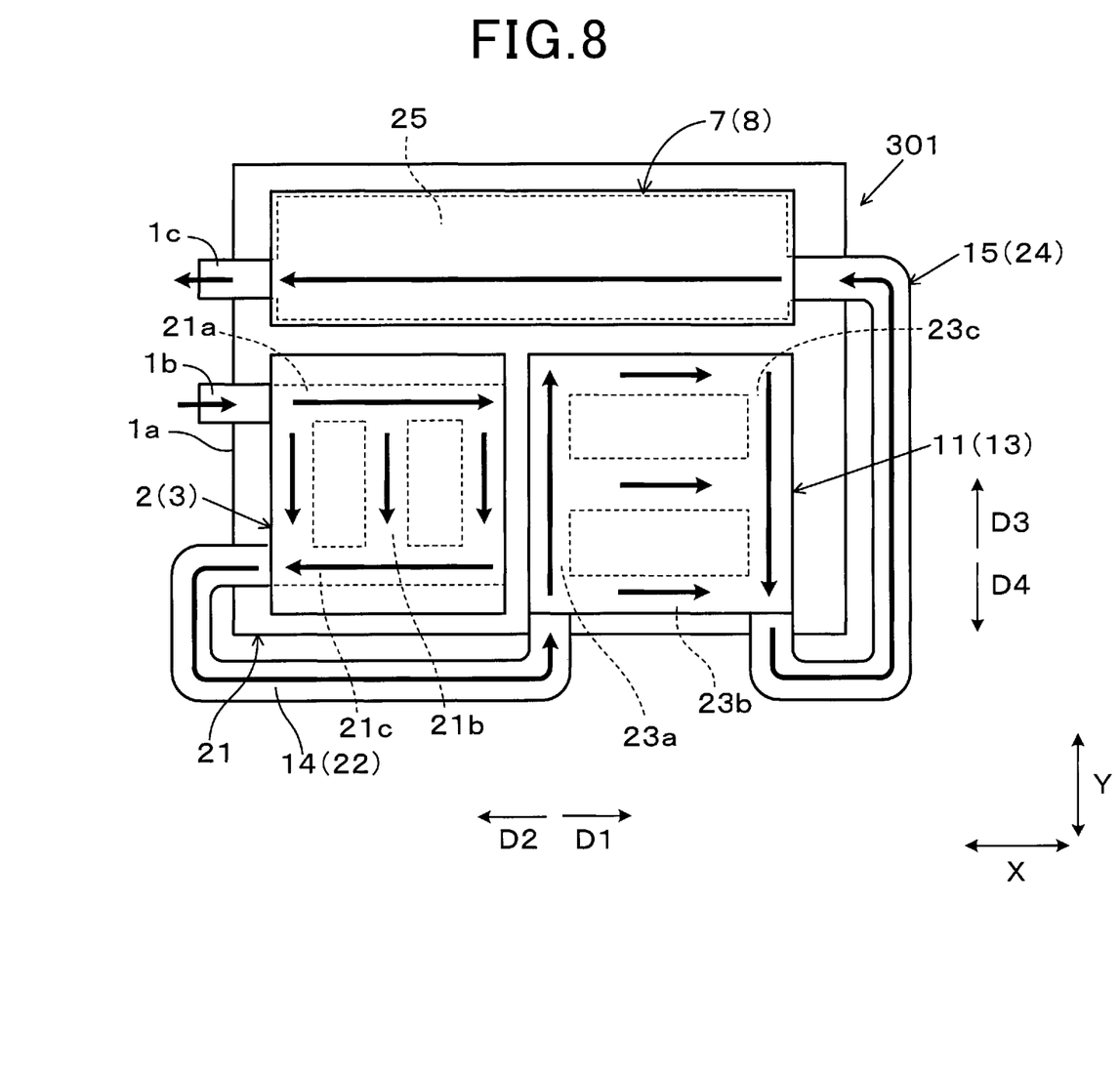
FIG. 8 is a schematic diagram illustrating a cooling structure of a power conversion device according to a fourth embodiment.

A power conversion device 301 of the fourth embodiment differs from the power conversion device 1 of the first embodiment in the structures of the coolant flow passage 21 of the semiconductor stack 2, the reactors 11, the coolant flow passage 23 of the reactors 11, the connecting pipe 14, and the connecting pipe 15.

Other structures are the same as those of the first embodiment.

As shown in FIG. 8, in the fourth embodiment, the inlet header 21a and the outlet header 21c, which constitute the coolant flow passage 21, are in reverse position from the position in the first embodiment. That is, the outlet header 21c is located at a position further from the capacitor 7 with the inlet header 21a located in between.

The reactors 11 are stacked in the orthogonal direction Y. Thus, in the coolant flow passage 23 for the reactors 11, the inlet header 23a and the outlet header 23c extend parallel to each other in the orthogonal direction Y. The inlet header 23a is located close to the semiconductor stack 2, and the cooling portions 23b extend in the stacking direction X between the inlet header 23a and the outlet header 23c.

The inlet of the connecting pipe 14 is connected to the left one of the both ends of the outlet header 21c in the stacking direction X in FIG. 8, and the outlet of the connecting pipe 14 is connected to the lower one of the both ends of the inlet header 23a in the orthogonal direction Y in FIG. 8.

Furthermore, the inlet of the connecting pipe 15 is connected to the lower one of the both ends of the outlet header 23c in the orthogonal direction Yin FIG. 8.

Thus, in the coolant flow passage 21, the coolant in the cooling portions 21b flows in the fourth direction D4 toward the outlet header 21c, and the coolant in the outlet header 21c flows toward the inlet of the connecting pipe 14 in the second direction D2. In the coolant flow passage 23, the coolant in the inlet header 23a flows from the outlet of the connecting pipe 14 in the third direction D3, the coolant in the cooling portions 23b flows toward the outlet header 23c in the first direction D1, and the coolant in the outlet header 23c flows toward the inlet of the connecting pipe 15 in the fourth direction D4.

According to the power conversion device 301 of the fourth embodiment, the coolant route in the coolant flow passage 21 is changed to cool the semiconductor stack 2, and the reactors 11 stacked in the orthogonal direction Y are cooled by the coolant in the coolant flow passage 23.

Additionally, the operational advantages that are the same as those of the first embodiment are achieved.

Fifth Embodiment

Figure 9:
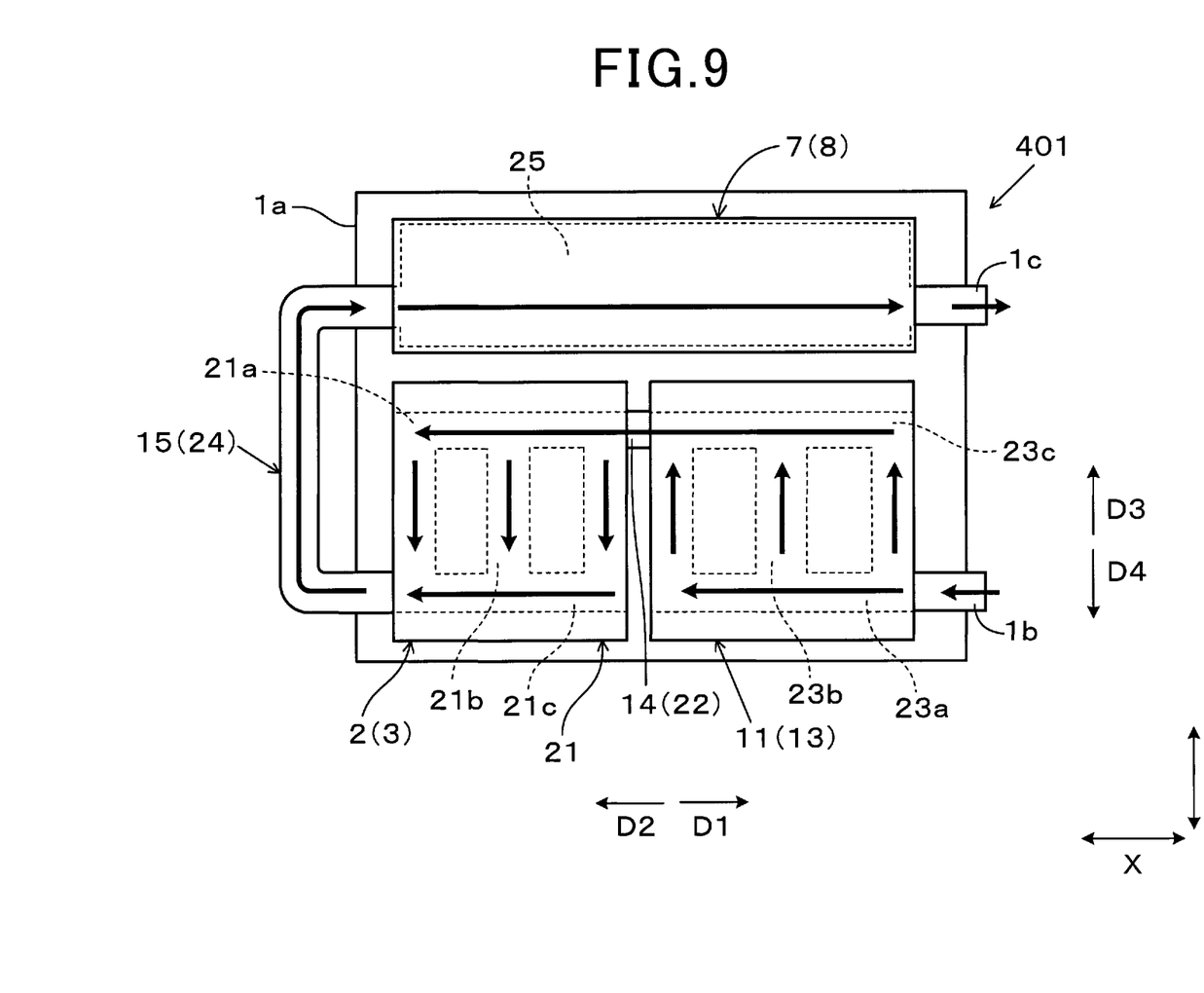
FIG. 9 is a schematic diagram illustrating a cooling structure of a power conversion device according to a fifth embodiment.

A power conversion device 401 of the fifth embodiment differs from the power conversion device 1 of the first embodiment in the coolant route from the inflow pipe 1b to the outflow pipe 1c.

Other structures are the same as those of the first embodiment.

As shown in FIG. 9, in the fifth embodiment, the coolant that has flowed in through the inflow pipe 1b first flows to the coolant flow passage 23 of the reactors 11 and then flows to the coolant flow passage 21 of the semiconductor stack 2.

In the coolant flow passage 23, the coolant that has flowed in through the inflow pipe 1b flows through the inlet header 23a in the second direction D2 while branching into the cooling portions 23b. The coolant in the cooling portions 23b flows in the third direction D3 toward the outlet header 23c. The coolant that have flowed through the cooling portions 23b merge to flow in the second direction D2 through the outlet header 23c toward the connecting pipe 14.

In the coolant flow passage 21, the coolant that has flowed in through the coolant flow passage 22 of the connecting pipe 14 flows through the inlet header 21a in the second direction D2 while branching into the cooling portions 21b. The coolant in the cooling portions 21b flows in the fourth direction D4 toward the outlet header 21c. The coolant that have flowed through the cooling portions 21b merge to flow in the second direction D2 through the outlet header 21c toward the connecting pipe 15.

According to the power conversion device 401 of the fifth embodiment, the coolant route from the inflow pipe 1b to the outflow pipe 1c cools the reactors 11, the semiconductor stack 2, and the capacitor 7 in this order.

Additionally, the operational advantages that are the same as those of the first embodiment are achieved.

Sixth Embodiment

Figure 10:
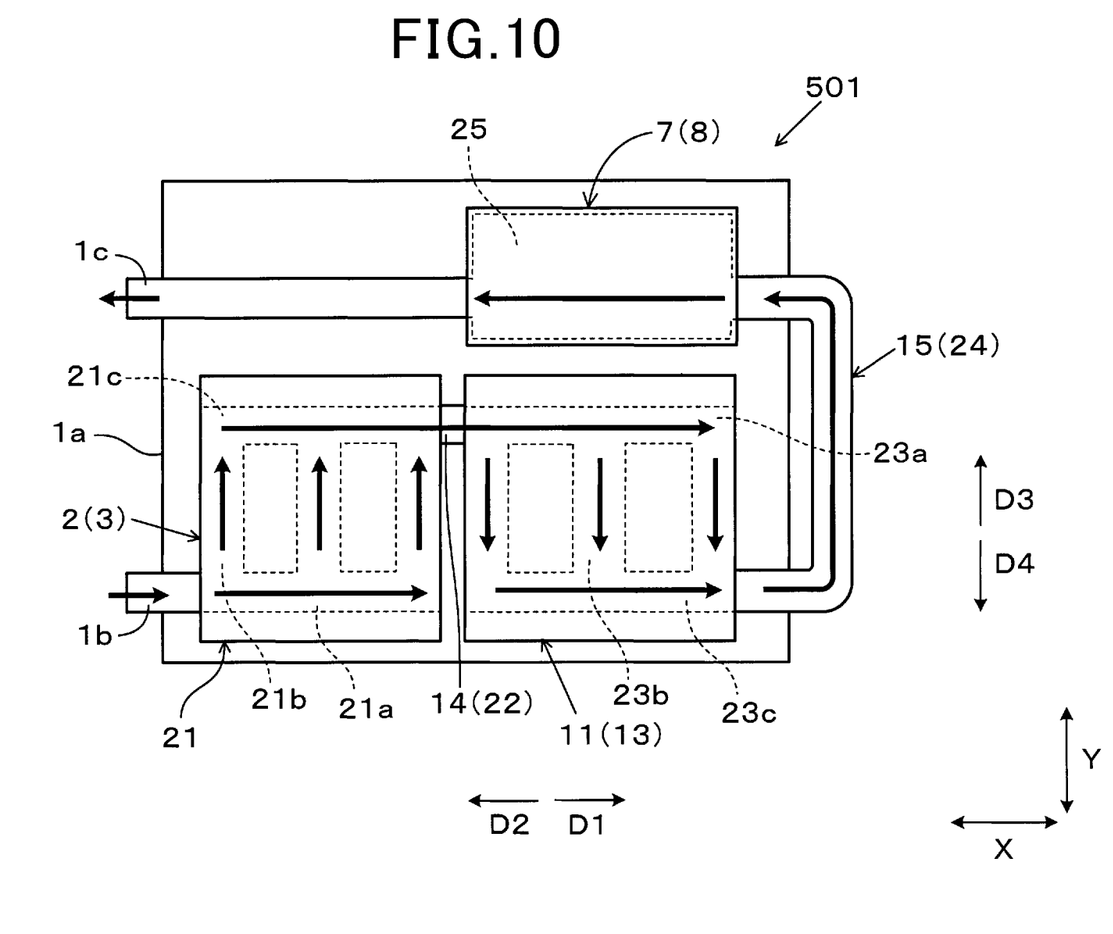
FIG. 10 is a schematic diagram illustrating a cooling structure of a power conversion device according to a sixth embodiment.

A power conversion device 501 of the sixth embodiment differs from the power conversion device 1 of the first embodiment in the position of the capacitor 7.

Other structures are the same as those of the first embodiment.

As shown in FIG. 10, in the sixth embodiment, the dimension of the capacitor 7 in the stacking direction X, that is, the dimension of the case 8a (refer to FIG. 1) in the stacking direction X is shorter than that in the first embodiment. While the capacitor 7 faces the reactors 11 in the orthogonal direction Y with the space 16 located in between, the capacitor 7 does not face the semiconductor stack 2.

According to the power conversion device 501 of the sixth embodiment, the position of the capacitor 7 with respect to the reactors 11 is changed.

Additionally, operational advantages that are the same as those of the first embodiment are achieved.

Seventh Embodiment

Figure 11:
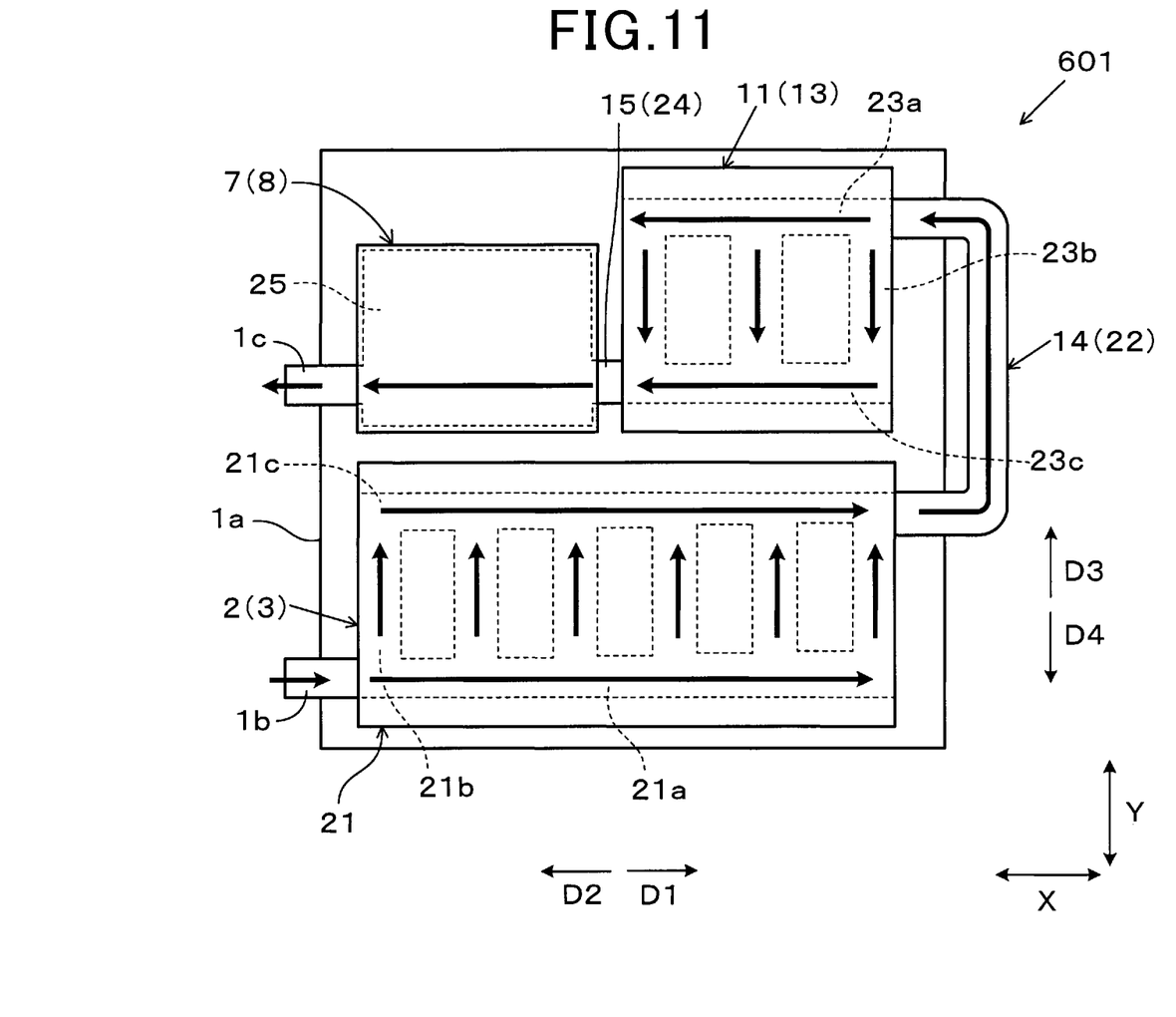
FIG. 11 is a schematic diagram illustrating a cooling structure of a power conversion device according to a seventh embodiment.

A power conversion device 601 of the seventh embodiment differs from the power conversion device 1 of the first embodiment in the positions of the semiconductor stack 2, the reactors 11, and the capacitor 7.

Other structures are the same as those of the first embodiment.

As shown in FIG. 11, in the seventh embodiment, the dimension of the semiconductor stack 2 in the stacking direction X is longer than that in the first embodiment, and the dimension of the capacitor 7 in the stacking direction X is shorter than that in the first embodiment. The reactors 11 and the capacitor 7 are located adjacent to each other in the stacking direction X.

According to the power conversion device 601 of the seventh embodiment, the positions of the semiconductor stack 2, the reactors 11, and the capacitor 7 are changed.

Additionally, operational advantages that are the same as those of the first embodiment are achieved.

Although the present disclosure has been described in accordance with the embodiments, it is understood that the present disclosure is not limited to the embodiments and the configurations. The present disclosure embraces various modifications and deformations that come within the range of equivalency. Additionally, various combinations and forms, or other combinations and forms including only one or more additional elements, or less than all elements are included in the scope and ideas obtainable from the present disclosure.

The above-described embodiments illustrate the cases in which the reactors 11 and the capacitor 7 are located adjacent to each other in the stacking direction X or the orthogonal direction Y. Instead, the structure may be employed in which the reactors 11 and the capacitor 7 are located adjacent to each other in the vertical direction Z.

The above-described embodiments illustrate the cases in which the coolant flow passage 25 of the capacitor 7 is located below the capacitor element 8 in the vertical direction Z. Instead or in addition, the coolant flow passage corresponding to the coolant flow passage 25 may be located above or on the side of the capacitor element 8.

The above-described embodiments illustrate the cases in which the coolant flow passages of the semiconductor stack 2, the reactors 11, and the capacitor 7 communicate with each other. Instead, the structure may be employed in which all the coolant flow passages of the three heat-producing components do not communicate with one another, or in which the coolant flow passages of only two of the heat-producing components communicate with each other.

In the above-described embodiments, the structure and the position of the coolant flow passage 21 of the semiconductor stack 2 and the structure and the position of the coolant flow passage 23 of the reactors 11 may be changed as required.

What is claimed is:

1. A power conversion device comprising:
a semiconductor stack that includes a plurality of semiconductor modules stacked on one another in a stacking direction, each semiconductor module including a semiconductor element;
a reactor that constitutes a boost circuit that boosts a direct-current voltage; and
a capacitor that is electrically connected to the plurality of semiconductor modules, wherein
the semiconductor stack, the reactor, and the capacitor each include a coolant flow passage, and the reactor and the capacitor are located adjacent to each other,
the coolant flow passage of the capacitor is located below a capacitor element of the capacitor in a vertical direction orthogonal to the stacking direction, and is configured to extend in the stacking direction, and
the coolant flow passage of the reactor includes a facing flow passage, which is located to face the capacitor element, and the facing flow passage is configured to extend in the stacking direction along the coolant flow passage of the capacitor.

2. The power conversion device according to claim 1, wherein the reactor is located adjacent to the semiconductor stack in the stacking direction, and the capacitor is located to face both the reactor and the semiconductor stack in an orthogonal direction orthogonal to both the stacking direction and the vertical direction.

3. The power conversion device according to claim 1, wherein the coolant flow passages of the respective semiconductor stack, reactor, and capacitor communicate with one another.

* * * * *